United States Patent [19]
Ohsawa

[11] 4,063,184
[45] Dec. 13, 1977

[54] SIGNAL TRANSFER CIRCUIT

[75] Inventor: Mitsuo Ohsawa, Fujisawa, Japan

[73] Assignee: Sony Corporation, Tokyo, Japan

[21] Appl. No.: 727,016

[22] Filed: Sept. 27, 1976

[30] Foreign Application Priority Data

Oct. 9, 1975  Japan ............................... 50-122275

[51] Int. Cl.² ............................................. H04B 1/16
[52] U.S. Cl. ................................... 328/221; 328/149;
328/165; 325/488; 307/296 R
[58] Field of Search ............... 325/378, 475, 484, 488;
328/258, 265, 266, 221, 149, 165, 167; 307/296

[56] References Cited
U.S. PATENT DOCUMENTS

| | | | |
|---|---|---|---|
| 3,493,871 | 2/1970 | Mason et al. ................... | 325/475 X |
| 3,882,405 | 5/1975 | Tajima et al. ................... | 328/149 X |
| 3,947,629 | 3/1976 | Tanaka et al. ................... | 325/488 X |

*Primary Examiner*—John S. Heyman
*Attorney, Agent, or Firm*—Lewis H. Eslinger; Alvin Sinderbrand

[57] ABSTRACT

A signal transfer circuit suitable for a monolithic integrated circuit is operable to transfer only a desired DC biasing voltage and AC signal component from an FM discriminator output to a multiplex stereo demodulator circuit or the like at its rear stage, with a DC component contained in the FM discriminator output being cancelled and hence not transferred. The signal transfer circuit is composed of a parallel connection of a first loop including a first FM discriminating signal source and a first resistor connected in series to each other, and a second loop consisting of a second FM discriminating signal source providing an output signal which is of the same level but of reverse phase in respect to the output signal of the first discriminating signal source, second and third resistors connected in series to the second signal source, and an AC signal by-pass capacitor connected between a connection point between the second and third resistors and a reference point. A connection point of the above-mentioned parallel connection is connected to a DC biasing voltage source and the other connection point thereof is connected to an output terminal of the signal transfer circuit.

7 Claims, 4 Drawing Figures

SIGNAL TRANSFER CIRCUIT

BACKGROUND OF THE INVENTION

1. Field of the Invention

This invention relates to a signal transfer circuit, and more particularly to a circuit for transferring an FM discriminator output to an amplifier, an FM multiplex demodulator or the like in the rear stage of an FM receiver.

2. Description of the Prior Art

In an existing FM radio receiver or AM-FM stereo radio receiver formed in an integrated circuit (IC), an FM demodulator circuit and a stereo demodulator circuit are formed in different respective monolithic IC chips, such as, monolithic middle-scale IC chips. In such case, the FM demodulator circuit produces a DC voltage comprised of a constant DC voltage and an S-curve DC voltage, and a composite stereo signal, such as, a pilot tone system FM stereo signal. However, in order to transfer only the composite stereo signal to the stereo demodulator circuit, a capacitor is externally connected between both IC chips and two external terminals are thus required solely for use in connecting such capacitor. Further, by reason of the foregoing, a biasing DC voltage produced in the FM demodulator circuit cannot be transmitted to the stereo demodulator circuit and, hence, a separated biasing DC voltage must be produced in the IC chip where the stereo demodulator circuit is formed.

OBJECTS AND SUMMARY OF THE INVENTION

Accordingly, it is an object of this invention to provide a signal transfer circuit which is free of the above described disadvantages of the prior art.

More particularly, it is an object of this invention to provide a signal transfer circuit suitable for a monolithic IC and by which an FM discriminator output may be transferred to a circuit at its rear stage, without connecting a capacitor therebetween so that the number of external terminals can be reduced.

It is a further object of this invention to provide a signal transfer circuit by which only an AC signal component and a DC bias component are transmitted and a DC component of large level, such as is produced by an FM discriminator, is cancelled and hence, not transmitted.

In accordance with an aspect of this invention, a signal transfer circuit is provided with a first loop including a first FM discriminator and a first resistor connected in series therewith, and such first loop is connected in parallel with a second loop including a second FM discriminator producing an output of the same level and of reverse phase relative to the output of the first FM discriminator, second and third resistors connected in series with the second FM discriminator and a capacitor connected between a connection point between the second and third resistors and a reference point. One parallel connection point of the first and second loops is connected to a DC biasing voltage source while the other parallel connection point is connected to an output terminal at which the AC signal component and the DC bias component may be applied, for example, to a stereo demodulator circuit.

The above, and other objects, features and advantages of this invention, will be apprent from the following detailed description of an illustrative embodiment to be read in conjunction with the accompanying drawings.

DETAILED DESCRIPTION OF PREFERRED EMBODIMENTS

Figure 1:
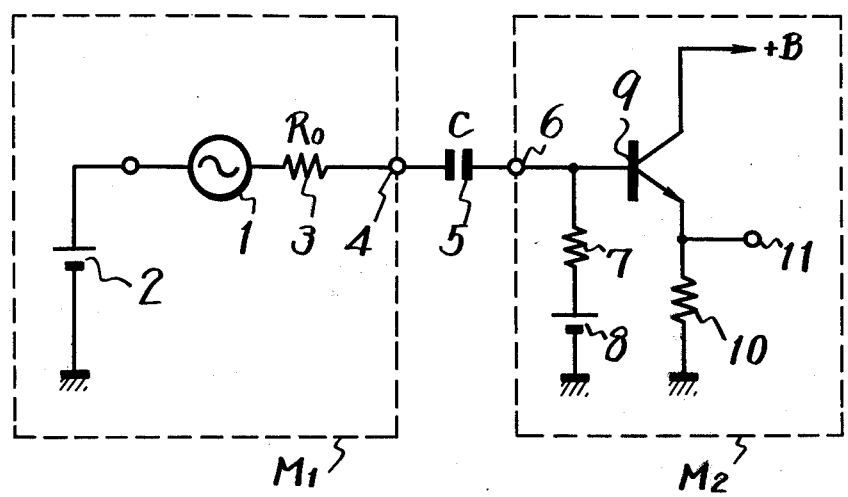
FIG. 1 is a connection diagram showing a prior art signal transfer circuit.

Before describing a signal transfer circuit according to this invention, reference is made to FIG. 1 in which a signal transfer circuit of the prior art is shown associated with an FM demodulator circuit formed on a monolithic IC chip $M_1$ and a stereo demodulator circuit formed on a monolithic IC chip $M_2$.

In the IC chip $M_1$, a signal source 1 producing a composite stereo signal and an S-curve DC voltage, a voltage source 2 providing a biasing DC voltage, and an impedance 3 of the signal source are connected in series between an external output terminal 4 and the ground. In the IC chip $M_2$, the base electrode of a transistor 9 is connected to an external input terminal 6 and also grounded through a series circuit of a resistor 7 and a biasing DC voltage source 8. The collector electrode of transistor 9 is connected to a power source $+B$ and the emitter electrode of transistor 9 is grounded through a resistor 10 and also connected through an output terminal 11 to a next-stage circuit (not shown). Finally, an external capacitor 5 is shown to be connected between the external terminals 4 and 6 of IC chips $M_1$ and $M_2$.

Even if the IC chips $M_1$ and $M_2$ are formed as one monolithic IC chips, that is, as a monolithic large-scale IC chip, the latter has to be provided with two external terminals used solely for connection of the external capacitor 5 of the signal transfer circuit which transmits only the composite stereo signal to the stereo demodulator circuit. Further, since the DC bias voltage is not transferred from the FM demodulator circuit to the stereo demodulator circuit, a biasing DC voltage must be separately provided, as by the DC biasing voltage source 8, for the stereo demodulator circuit.

Figure 2:
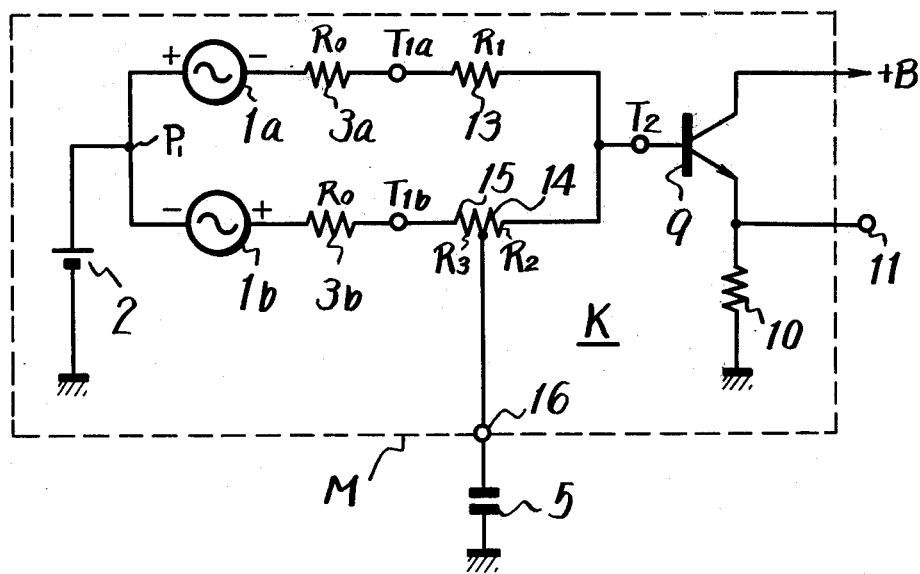
FIG. 2 is a connection diagram showing a signal transfer circuit according to one embodiment of this invention.

Referring now to FIG. 2, it will be seen that a signal transfer circuit K according to an embodiment of this invention which avoids the above disadvantages of the prior art is there shown applied to an AM-FM stereo radio receiver.

In FIG. 2, reference letter M denotes a monolithic large-scale IC chip in which there are formed in intermediate frequency amplifier circuit, an FM demodulator circuit, a demodulated composite stereo signal amplifier circuit and a tuning signal forming circuit as the FM receiving system, a mixer circuit, a local oscillator circuit, an intermediate frequency amplifier circuit, an AM detector circuit, an AGC circuit and a muting circuit as the AM receiving system, a stereo demodulator circuit and the like. The foregoing circuits in monolithic large-scale IC chip M may be conventional and are neither illustrated nor described in detail herein.

The signal transfer circuit K according to this invention is shown on FIG. 2 to comprise a first resistor 13 of resistance value $R_1$ connected at one end to a first input terminal $T_{1a}$ and at its other end to an output terminal $T_2$. A second resistor 14 of resistance value $R_2$ is connected at one end through a third resistor 15 of resistance value $R_3 (R_3 = R_1 - R_2)$ to a second input terminal $T_{1b}$ and the other end of resistor 14 is connected to the output terminal $T_2$. The connection point between second and third resistors 14 and 15 is grounded through a capacitor 5. The capacitor 5 is an externally connectable capacitor and is shown to be connected between an external terminal 16 and the ground.

Figure 4:
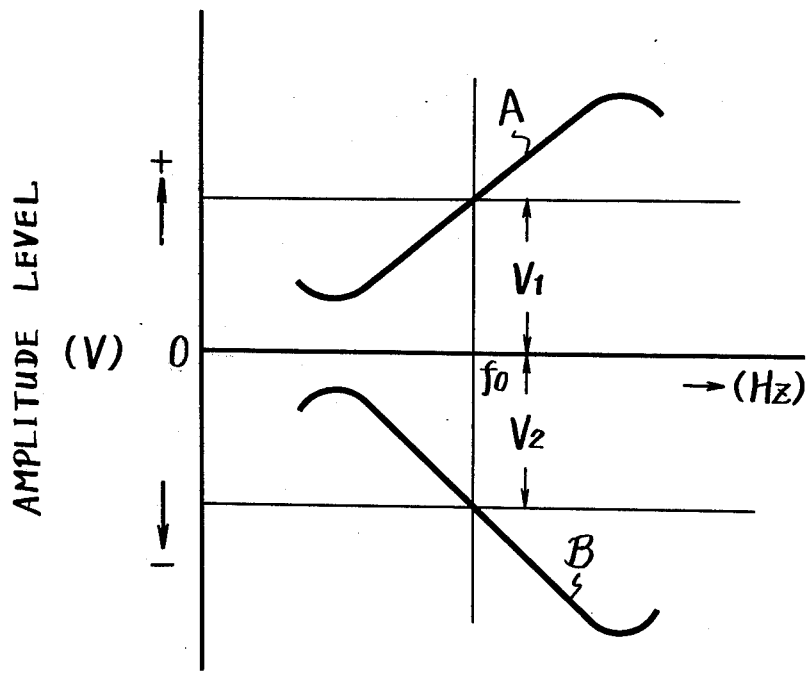
FIG. 4 is a graph showing the output characteristic curves of two FM discriminators having outputs whose phases are reversed in respect to each other and which are employed in the signal transfer circuit according to this invention.

An output signal source 1a of one FM discriminator is connected between the first input terminal $T_{1a}$ and a reference point $P_1$ and an output signal source 1b of another FM discriminator which provides an output signal that is reverse in phase to, and substantially of the same level as the output signal from source 1a is connected between the second input terminal $T_{1b}$ and the reference point $P_1$. The discriminator output from source 1a exhibits an S-shaped variation on a constant DC voltage $V_1$ as shown by the curve A on FIG. 4, and the discriminator output from the other source 1b exhibits an S-shaped variation on a constant DC voltage $V_2$ as shown by the curve B. Further, on FIG. 2, the impedance components of the FM discriminator output signal sources 1a and 1b are represented by resistors 3a and 3b, respectively, which each have a resistance value $R_o$. Finally, in the signal transfer circuit K of FIG. 2, the output terminal $T_2$ is connected to the transistor amplifier 9 serving as a rear-stage circuit, and the biasing voltage source 2 is connected between the connection point $P_1$ of the FM discriminator output signal sources 1a and 1b and a reference point or ground so as to study its biasing voltage through the above described transfer system K to the transistor 9.

Figure 3:
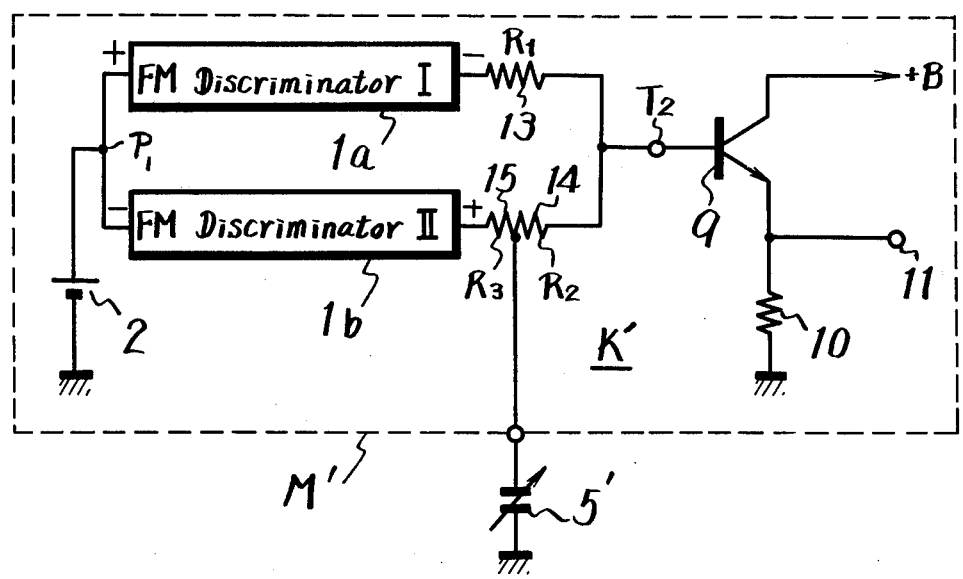
FIG. 3 is a connection diagram showing another embodiment of a signal transfer circuit according to this invention.

Referring now to FIG. 3, it will be seen that, in a signal transfer circuit K' which is otherwise similar to the above described circuit K, and in which the corresponding components are identified by the same reference numerals, the external capacitor 5 of circuit K is replaced by a variable external capacitor 5' so as to permit the level of the transferred AC signal to be varied thereby.

The signal transfer circuit K of FIG. 2 may be analyzed as follows:

Assuming at first that the voltage sources 1a and 1b are short-circuited, then the constant DC voltage from the voltage source 2 can be obtained between the output terminal $T_2$ and the ground through a resistance circuit having composite resistance value $(R_O + R_1)/2$.

If it is next assumed that the voltage source 2 is short-circuited and further that a current flowing through voltage source 1b, impedance 3b, resistor 15 and capacitor 5 is $i_1$; a current flowing through voltage source 1b, impedance 3b, resistor 15, resistor 14, resistor 13, impedance 3a and voltage source 1a is $i_2$; the capacitance of the capacitor 5 is C and the reactance thereof is $X_c$; then the voltage $e_i$ of the voltage sources 1a and 1b is expressed by the following equations relative to the paths of the currents $i_1$ and $i_2$:

$$e_i = (R_O + R_1 - R_2) \cdot (i_1 + i_2) + i_1 X_c \quad (1)$$

$$2e_i = (R_O + R_1 - R_2) \cdot (i_1 + i_2) + (R_O + R_1 R_2) \cdot i_2 \quad (2)$$

The above equations (1) and (2) may be rearranged relative to $i_1$ and $i_2$ as follows:

$$\begin{pmatrix} (R_0 + R_1 - R_2 + X_c) & (R_0 + R_1 - R_2) \\ (R_0 + R_1 - R_2) & 2(R_0 + R_1) \end{pmatrix} \begin{pmatrix} i_1 \\ i_2 \end{pmatrix} = \begin{pmatrix} e_i \\ 2e_i \end{pmatrix} \quad (3)$$

Equation (3) is solved for $i_1$ and $i_2$ as follows:

$$i_1 = \frac{2R_2}{\Delta} \cdot e_i \quad (4)$$

$$i_2 = \frac{2X_c}{\Delta} \cdot e_i \quad (5)$$

Where $\Delta$ is expressed by the following equation:

$$\Delta = (R_0 + R_1)^2 + 2(R_0 + R_1) \cdot X_c - R_2^2 \quad (6)$$

An output voltage $e_o$ between the output terminal $T_2$ and the ground is written as follows:

$$e_0 = e_i - (R + R) \cdot i_2 = \left(1 - \frac{2(R_0 + R_1)}{\Delta} \cdot X_c \right) e_i \quad (7)$$

From the above equations, a transfer function $A(j\omega) = \lambda$ $e_o/e_i$ is expressed as follows:

$$A(j\omega) = \frac{\Delta - 2(R_0 + R_1) \cdot X_c}{\Delta} \quad (8)$$

$$= \frac{(R_0+R_1)^2 - R_2^2}{(R_0 + R_1)^2 + 2(R_0 + R_1) \cdot X_c - R_2^2}$$

$$= \frac{1}{1 - j\left(\frac{\omega c}{\omega}\right)}$$

In the above equation (8), $\omega_c$ may be expressed as follows:

$$\omega c = \frac{1}{C\left(\frac{(R_0 + R_1)^2 - R_2^2}{2(R_0 + R_1)}\right)} = \frac{1}{C \cdot R_{eq}} \quad (9)$$

where $R_{eq}$ is expressed as follows:

$$R_{eq} = \frac{(R_0 + R_1)^2 - R_2^2}{2(R_0 + R_1)} \quad (10)$$

On the other hand, in the prior art circuit of FIG. 1, if the voltage sources 2 and 8 are short-circuited and the resistance values of the resistors 3 and 7 are taken as $R_C$ and $R_L$, respectively, the transfer function $A(j\omega)$ for the known signal transfer circuit is expressed by the following equation:

$$A(j\omega)\left(\frac{R_L}{R_0 + R_L}\right)\left(\frac{1}{1 - j\left(\frac{\omega c'}{\omega}\right)}\right) \quad (11)$$

where $\omega c'$ is expressed as follows:

$$\omega c' = \frac{1}{C \cdot (R_0 + R_L)} \quad (12)$$

Accordingly, from equations (8) and (11) and equations (9) and (12) the following relation may be obtained:

$$\frac{(R_0 + R_1)^2 + R_2^2}{2(R_0 + R_1)} = R_o + R_L \quad (13)$$

If the capacitance C is the same for both the prior art circuit of FIG. 1 and the embodiment of this invention shown on FIG. 2, it is noticed that the signal transfer circuit K of FIG. 2 forms a high-pass filter which is equivalent relative to the output signal sources 1a and 1b to that formed by the capacitor 5 and the resistor 7 of FIG. 1 relative to the voltage or output signal source 1.

Accordingly, if the cut-off frequency of the signal transfer circuit K shown on FIG. 2 is previously selected to be, for example, about 20 Hz, the signal component of AC voltage is transmitted, as it is, to the output terminal $T_2$, while DC voltages produced at the FM discriminator output signal sources 1a and 1b cancel each other because of their being substantially of the same level and reversed in phase with the result that such DC voltages will not appear as an output. However, the desired DC biasing voltage can be supplied to transistor 9 through the loop comprised of signal source 1a and resistor 13 and the loop comprised of signal source 1b and resistors 14 and 15.

Thus, in the signal transfer circuit according to this invention, as described above, it is possible to ensure, in a signal transfer circuit of simple construction, that the DC voltage produced by the FM discriminator is not transferred to the next stage and that only the AC signal component and desired DC biasing voltage are supplied to such next stage. Therefore, a constant DC biasing voltage source need not be provided at every stage and only one external terminal is required for connecting the externally connectable capacitor 5' to the IC chips.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:
1. A signal transfer circuit comprising:
    a first loop including a first signal source providing an output signal which is composed of an AC signal component superimposed on a DC voltage, and a first resistor connected in series with said first signal source;
    a second loop including a second signal source providing an output signal of substantially the same level as said output signal from the first signal source but of reversed polarity in respect to the latter, second and third resistors connected in series with said second signal source, and a capacitor connected between a reference point and a connection point of said second resistor with said third resistor;
    means connecting said first and second loops in parallel with each other at opposed connection points; and
    an output terminal connected with one of said connection points at which the first and second loops are connected in parallel.
2. A signal transfer circuit according to claim 1; in which said first resistor has a resistance value substantially equal to the sum of the resistance values of said second and third resistors, respectively.
3. A signal transfer circuit according to claim 1; further comprising a DC biasing voltage source connected with the other of said connection points at which the first and second loops are connected in parallel.
4. A signal transfer circuit according to claim 1; in which said first and second signal sources are respective FM discriminator outputs.
5. A signal transfer circuit according to claim 1; in which said capacitor in said second loop is variable.
6. A signal transfer circuit according to claim 1; in which said first resistor has a resistance value substantially equal to the sum of the resistance values of said second and third resistors, respectively; a DC biasing voltage source is connected with the other of said connection points at which the first and second loop are connected in parallel; and said first and second signal sources are respective FM discriminator outputs.
7. A signal transfer circuit according to claim 6; in which said capacitor in the second loop is variable.

* * * * *